United States Patent [19]

Yotsuyanagi

[11] Patent Number: 5,446,397
[45] Date of Patent: Aug. 29, 1995

[54] CURRENT COMPARATOR

[75] Inventor: Michio Yotsuyanagi, Tokyo, Japan

[73] Assignee: NEC Corporation, Tokyo, Japan

[21] Appl. No.: 22,290

[22] Filed: Feb. 25, 1993

[30] Foreign Application Priority Data

Feb. 26, 1992 [JP] Japan .................... 4-039837

[51] Int. Cl.[6] ............................ H03K 5/153
[52] U.S. Cl. .......................... 327/66; 327/77;
327/78; 330/288; 323/315
[58] Field of Search ............... 307/354, 355, 358, 362,
307/363, 490, 494, 296.1, 296.6, 296.5; 323/313,
315; 327/58, 60, 62, 63, 66, 68, 70, 72, 77-79,
82, 85, 88; 330/288

[56] References Cited

U.S. PATENT DOCUMENTS

| | | | |
|---|---|---|---|
| 3,909,628 | 9/1975 | Muto | 323/315 |
| 4,603,291 | 7/1986 | Nelson | 323/315 |
| 4,649,301 | 3/1987 | Van Tran | 307/362 |
| 4,751,410 | 6/1988 | Tanizawa | 307/572 |
| 4,825,104 | 4/1989 | Yamakoshi et al. | 307/355 |
| 4,943,736 | 7/1990 | Kihara et al. | 307/494 |
| 4,958,123 | 9/1990 | Hughes | 307/353 |
| 4,967,140 | 10/1990 | Groeneveld et al. | 323/315 |
| 5,039,888 | 8/1991 | Bell et al. | 307/355 |
| 5,055,719 | 10/1991 | Hughes | 307/491 |
| 5,057,792 | 10/1991 | Gay | 323/315 |
| 5,111,071 | 5/1992 | Kwan et al. | 307/350 |
| 5,136,184 | 8/1992 | Deevy | 307/494 |
| 5,173,656 | 12/1992 | Seevinck et al. | 307/296.8 |
| 5,180,929 | 1/1993 | Kokubun | 307/355 |
| 5,187,396 | 2/1993 | Armstrong, II | 307/296.8 |
| 5,206,552 | 4/1993 | Iwashita | 307/355 |

OTHER PUBLICATIONS

Nairn et al, "Current-Mode Algorithmic Analog-to-Digital Converters", IEEE Journal of Solid-State Circuits, vol. 25, No. 4, Aug. 1990, pp. 997-1004.

Primary Examiner—Timothy P. Callahan
Assistant Examiner—T. Lam
Attorney, Agent, or Firm—Leydig, Voit & Mayer

[57] ABSTRACT

Current output terminals of first and second current mirror circuits are connected. An input terminal of a third current mirror circuit is connected to a node of the current output terminals of the first and second current mirror circuits. A load circuit is connected between a current output terminal of the third current mirror circuit and a first voltage. An output terminal is connected to the load circuit. First and second currents to be compared with each other are supplied to current input terminal of the first and second current mirror circuits.

11 Claims, 5 Drawing Sheets

CURRENT COMPARATOR

BACKGROUND OF THE INVENTION

1. Field of the Invention

The present invention relates to a comparator for comparing levels of a plurality of currents and detecting the order of the levels.

2. Description of the Related Art

It has been difficult to directly compare one current level with another. For this reason, therefore, a plurality of current levels conventionally are converted to corresponding voltage levels by using resistors or the like to compare the current levels. Then, the voltage levels are compared by a voltage comparator. However, according to this method, the current levels change depending on the resistors used. Thus, a current level cannot be determined with greater accuracy.

An article titled "Current-mode algorithmic analog-to-digital converter", IEEE Journal of solid state circuits, vol. 25, No. 4, pp997–1004, 1990, shows circuits for comparing two current levels. FIGS. 1, 4 and 7 of the above article show a circuit which compares two current levels with each other by using a voltage comparator. FIG. 3 of the article shows a basic circuit configuration for comparing two current levels with each other, in which the output current of one current driver is supplied to the other current driver, and the node of the two current drivers is connected to the input terminal of an inverter.

However, according to the arrangement disclosed in this article, the time required for charging and discharging gate capacitances of the inverter is prolonged when two current levels approximate each other. As a result, the operation speed is slow. Further, a through or rush current flows through the inverter, resulting in increased power dissipation.

SUMMARY OF THE INVENTION

The present invention has been developed in view of the above drawbacks and its object is to provide a current comparator employed a comparatively little hardware, and which can compare current levels at high speed.

Another object of the present invention is to provide a current comparator which can compare current levels with high accuracy.

In order to achieve the above objects, a current comparator according to the present invention comprises:

first and second input terminals to which first and second currents to be compared with each other enter;

a first current mirror circuit, whose current input terminal is connected to the first input terminal;

a second current mirror circuit, whose current input terminal is connected to the second input terminal and whose current output terminal is connected to a current output terminal of the first current mirror circuit;

a third current mirror circuit, whose current input terminal is connected to a node of the current output terminals of the first and second current mirror circuits;

a load circuit connected between a current output terminal of the third current mirror circuit and a terminal to which a first voltage is applied; and a comparison result output terminal connected to the load circuit.

According to the current comparator arranged as above, when the first current is larger than the second current, the second current flows into the second current mirror circuit, and the difference between the first and second currents is supplied to the third current mirror circuit. On the other hand, when the first current is smaller than the second current, the first current enters to the second current mirror circuit, and no current enters to the third current mirror circuit.

The third current mirror circuit provides at its current output terminal a current equivalent to the difference between the first and second currents when the first current is larger than the second current, and sets the current output terminal thereof in an open state when the first current is smaller than the second current. Accordingly, when the first current is larger than the second current, a voltage drop corresponding to the difference between the first and second currents occurs at the load circuit. When the first current is smaller than the second current, no voltage drop occurs at the load circuit. Accordingly, a voltage signal corresponding to the difference between the first and second currents appears at the comparison result output terminal.

DETAILED DESCRIPTION OF THE PREFERRED EMBODIMENTS

Figure 1:
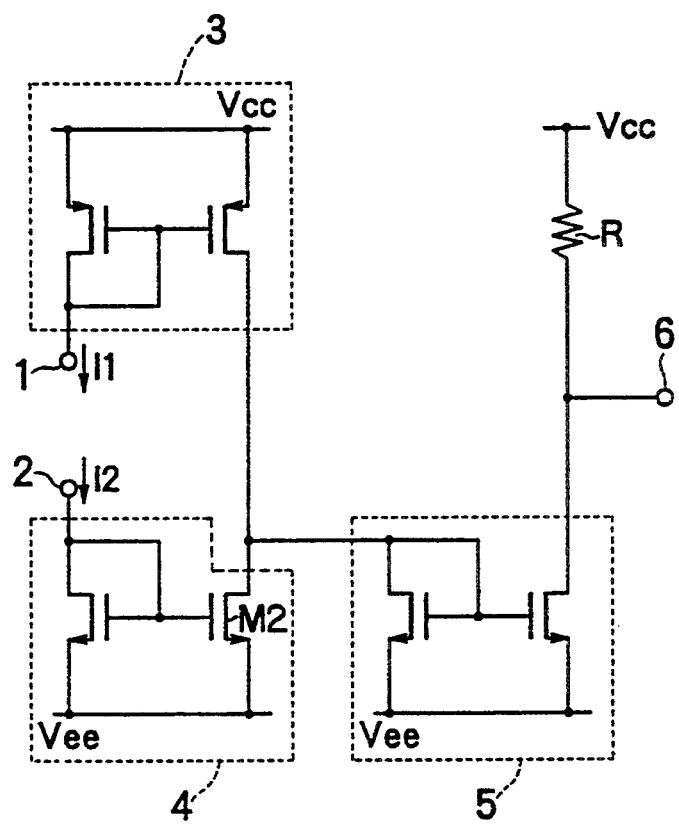
FIG. 1 is a circuit diagram of a current comparator according to a first embodiment of the present invention.

An embodiment of the present invention will now be described. FIG. 1 is a circuit diagram of a current comparator according to a first embodiment of the present invention. Thus current comparator shown in FIG. 1 comprises a first input terminal 1, a second input terminal 2, a first current mirror circuit 3, a second mirror circuit 4, a third mirror circuit 5, a comparison result output terminal 6, and a resistor (load) R.

The first current mirror circuit 3 is connected to a voltage to which a high power-source voltage Vcc is applied, and a current input terminal thereof is connected to the first input terminal 1. The second current mirror circuit 4 is connected a terminal to which a low power-source voltage Vee, for example, a ground level is applied, and a current input terminal thereof is connected to the current input terminal 2. The respective current output terminals of the first and second current mirror circuits 3 and 4 are connected to each other.

The second current mirror circuit 4 comprises transistors whose conductivity type (N-channel) is different from that (P-channel) of transistors constituting the first current mirror circuit 3.

The third current mirror circuit 5 is connected to a terminal to which the low power-source voltage Vee is applied, and a current input terminal thereof is connected to a node of the first and second current mirror circuits 3 and 4. The third current mirror circuit 5 comprises transistors whose conductivity type (N-channel) is the same as that of the transistors constituting the second current mirror circuit 4. The resistor R is connected between a current output terminal of the third current mirror circuit 5 and the terminal to which the high power-source voltage Vcc is applied. The comparison result output terminal 6 is connected to a node of the current output terminal of the third current mirror circuit 5 and the resistor R.

Operation of the current comparator of this embodiment shown in FIG. 1 will be described below with reference to FIG. 1.

Figure 2:
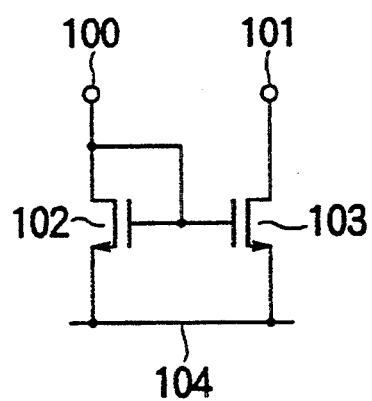
FIG. 2 is a circuit diagram of a basic current mirror circuit.

However, before describing the overall operation of the current comparator shown in FIG. 1, a current mirror circuit will now be described FIG. 2 shows an example of a basic current mirror circuit constituted by N-channel MOS (NMOS) transistors. This current mirror circuit comprises a current input terminal 100, a current output terminal 101, N-channel MOS transistors 102, 103, and a constant voltage terminal 104.

Assume now that the channel length and the channel width of the input-side N-channel MOS transistor 102 are Li and Wi, respectively, and the channel length and the channel width of the output-side N-channel MOS transistor 103 are Lo and Wo, respectively. Further, let it be assumed that the current mirror circuit operates in a saturation state and the current entering to the current input terminal 100 is Ii. The current mirror circuit shown in FIG. 2 provides or flows a current Io shown in equation (1) at the current output terminal 101.

$$Io = (Wo/Lo)/(Wi/Li) \times Ii \qquad (1)$$

If the size ratio of the output-side transistor 103 and the input-side transistor 102 is set to 1 [(Wo/Lo):(Wi/Li)=1:1], the output current Io equals to the input current Ii. If the size ratio of the transistors is A:1, the output current Io is A times the input current Ii.

Operation of the current comparator shown in FIG. 1 will now be described. To easily understand the operation of this circuit, assume that the size ratio (Wo/Lo) of the input- and output-side transistors of each of the first to third current mirror circuits 3, 4, and 5 is 1:1 in the following explanation. If the size ratio of the transistors is A:1, the same operation as when the size ratio is 1:1 is performed, except that the proportional coefficient A is introduced.

The first current mirror circuit 3 causes to flow through its current output terminal a current equal to the current I1 entering to the input terminal 1. Similarly, the second current 7 mirror circuit 4 causes to flow through its current output terminal a current equal to a current I2 supplied to the input terminal 2. There will now be described two cases, where I1>I2 and I1≦I2, respectively.

i) I1>I2

The first current mirror circuit 3 flows through its current output terminal a current equivalent to the current I1 entering the input terminal 1. Similarly, the second current mirror circuit 4 causes to flow through its current output terminal a current identical to the current I2 entering to the input terminal 2.

In accordance with Kirchhoff's Current Law, current (I1-I2) flows into the current input terminal of the third current mirror circuit 5. Accordingly, the third current mirror circuit 5 causes the current (I1-I2) to flow through the current output terminal thereof. A voltage drop occurs across resistor R due to the current (I1-I2), and thus the potential V0 at the comparison result output terminal 6 is as represented by equation (2).

$$V0 = Vcc - (I1 - I2)R \qquad (2)$$

ii) I1≦I2

A current supplied from the current output terminal of the first current mirror circuit 3 to the current output terminal of the second current mirror circuit 4 is only I1. Accordingly, the second current mirror circuit 4 cannot flow a current equivalent to the input current I2 through the output transistor. Because of this reason, the output transistor M2 operates in a non-saturated region.

Now, let it be assumed that element constant K2 (K2=u·Cox·W/L, u:mobility, Cox:unit gate capacitance) satisfies equation (3).

$$K2 \geq 2 \cdot I2 / Vt^2 \qquad (3)$$

where Vt represents a threshold voltage.

If the gate source voltage of the output transistor is represented by a symbol Vg, the following equation (4) is established.

$$I2 = K2 \cdot (Vg - Vt)^2 / 2 \qquad (4)$$

From equation (3), equation (5) is obtained.

$$I2 \leq K2 \cdot Vt^2 / 2 \qquad (5)$$

From equations (4) and (5), the following equation (6) is obtained.

$$K2 \cdot (Vg - Vt)^2 / 2 \leq K2 \cdot Vt^2 / 2 \qquad (6)$$

From equation (6), equation (7) is obtained.

$$Vg - Vt \leq Vt \qquad (7)$$

Since the output transistor operates in a non-saturated region, equation (8) is obtained.

$$Vd < Vg - Vt \qquad (8)$$

From equations (7) and (8), equation (9) is obtained.

$$Vd < Vt \qquad (9)$$

If Vd<Vt, the third current mirror circuit 5 is cut off and no current flows through either the input transistor or the output transistor. Accordingly, the voltage of the comparison result output terminal 6 is Vcc. It is easy to set the transistor element constant K2 to satisfy the equation (2). Accordingly, a current comparator can be easily arranged where the potential of the comparison result output terminal 6 becomes Vcc when I1≦I2.

As is apparent from the above description, the current comparator shown in FIG. 1 compares the input current I1 with the input current I2, and sets the voltage at the comparison result output terminal 6 to a voltage obtained from equation (2) when I1>I2 and to a power source voltage Vcc when I1≦I2.

Figure 3A:
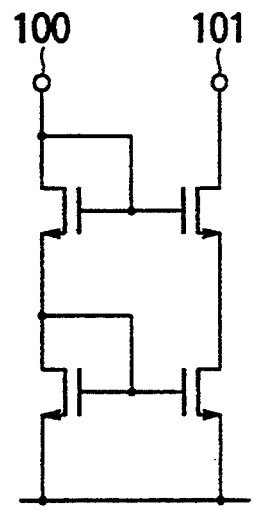
FIG. 3A is a circuit diagram of a cascode current mirror circuit.
Figure 3B:
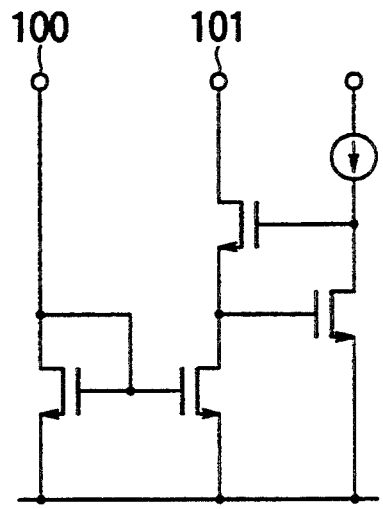
FIG. 3B is a circuit diagram of an active feedback current mirror circuit.

It should be noted that in the embodiment shown in FIG. 1, each of the first to third current mirror circuits 3, 4, and 5 comprises a basic current mirror circuit shown in FIG. 2. However, the present invention is not limited thereto. Other current mirror circuits, for example, the cascode current mirror circuit shown in FIG. 3A and the active feedback mirror circuit shown in FIG. 3B can be used as the first to third current mirror circuits 3 to 5.

Figure 4:
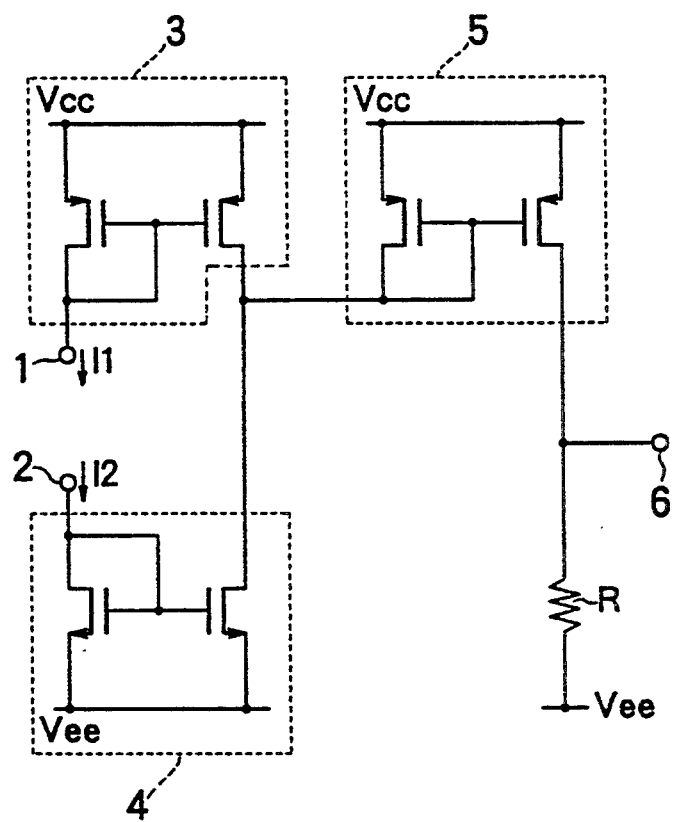
FIG. 4 is a circuit diagram of a current comparator according to a second embodiment of the present invention.

FIG. 4 shows a current comparator according to a second embodiment of the present invention. The current comparator shown in FIG. 4 differs from the current comparator shown in FIG. 1 in that (1) the third current mirror circuit 5 is constituted by a P-channel MOS transistor, and (2) the resistor R is connected between the current output terminal of the third current mirror circuit 5 and a terminal to which the low power-source voltage Vee is applied.

The current comparator circuit shown in FIG. 4 compares the input current I1 with the input current I2 and sets the voltage at the comparison result output terminal 6 to Vee when I1≧I2 and to a voltage obtained from equation (10) when I1<I2.

$$Vo = Vee + (I2 - I1)R \qquad (10)$$

A conventional current comparator converts currents to voltages in order to compare them. The current comparators in the first and second embodiments of the present invention compares currents as they are, with the result that a high speed comparison can be realized. Further, the number of elements constituting the circuit is small, so that the circuits of the first and second embodiments are easy to incorporated in an integrated circuit.

Figure 5:
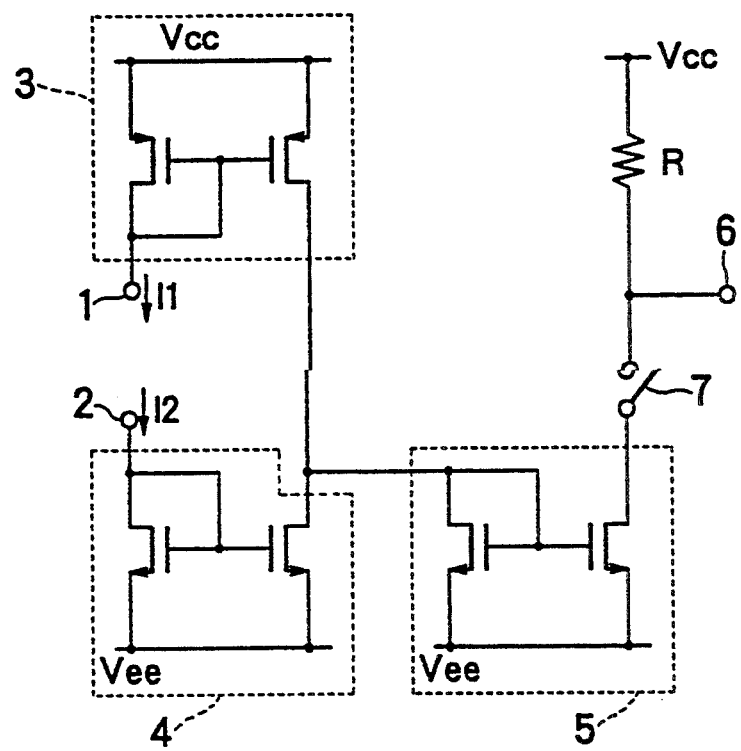
FIG. 5 is a circuit diagram of a current comparator according to a third embodiment of the present invention.

A third embodiment of the present invention will now be described, with reference to FIG. 5. The current comparator shown in FIG. 5 is characterized in that a switch 7 is connected between the current output terminal of the third current mirror circuit 5 and the resistor R. According to the circuit shown in FIG. 5, the switch 7 is closed to make the current flow through the output transistor of the third current mirror circuit 5 and the resistor R only when currents are compared. This results in low power dissipation. When the current comparator is not performing a comparison operation, the voltage of the comparison result output terminal 6 is fixed to a power source voltage Vcc. Accordingly, the voltage of the comparison result output terminal 6 can be used as a reset signal or the like for a system using this current comparator.

Figure 6:
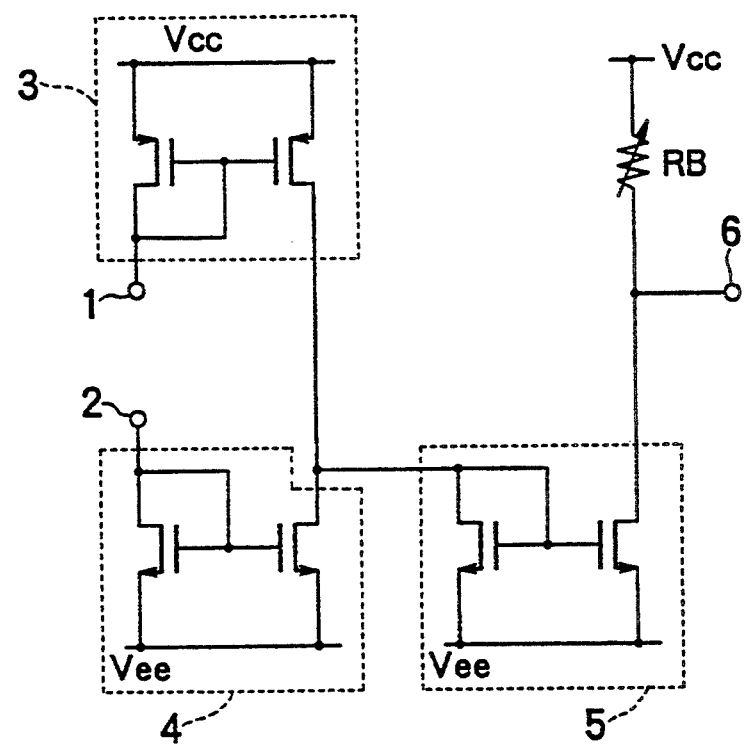
FIG. 6 is a circuit diagram of a current comparator according to a fourth embodiment of the present invention.

A fourth embodiment will now be described, with reference to FIG. 6. This current comparator is characterized by the use of a variable resistor VR in place of a fixed resistor R. The use of the variable resistor VR allows the output voltage Vo given by the equation (2) to be varied. Accordingly, the logic level of the output signal of the current comparator can be set to an arbitrary level such as a CMOS level, a TTL level, or an ECL level. As a result, the applicability of this current comparator is broadened. Further, when this current comparator is used together with other digital signal processing circuits, no level converter is required. Since the resistor value can be varied depending on the difference in level of the currents to be compared, an optimum logical amplitude can be obtained.

Figure 7:
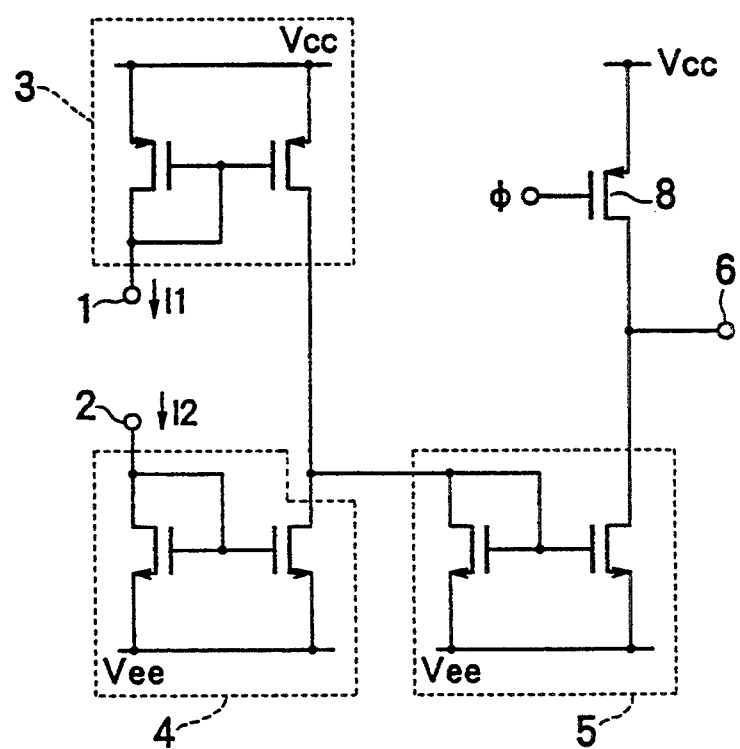
FIG. 7 is a circuit diagram of a current comparator according to a fifth embodiment of the present invention.

A fifth embodiment of the present invention will now be described, with reference to FIG. 7. This current comparator is characterized in that (1) a transistor 8 is used in place of the resistor R, and (2) turning on and off of the transistor 8 is controlled by clock φ.

A similar operation as in the case of FIG. 1 can be realized by turning on the transistor 8 to function as the resistor R. If the transistor 8 is turned off, no current flows into it, resulting in reduced power dissipation.

Figure 8:
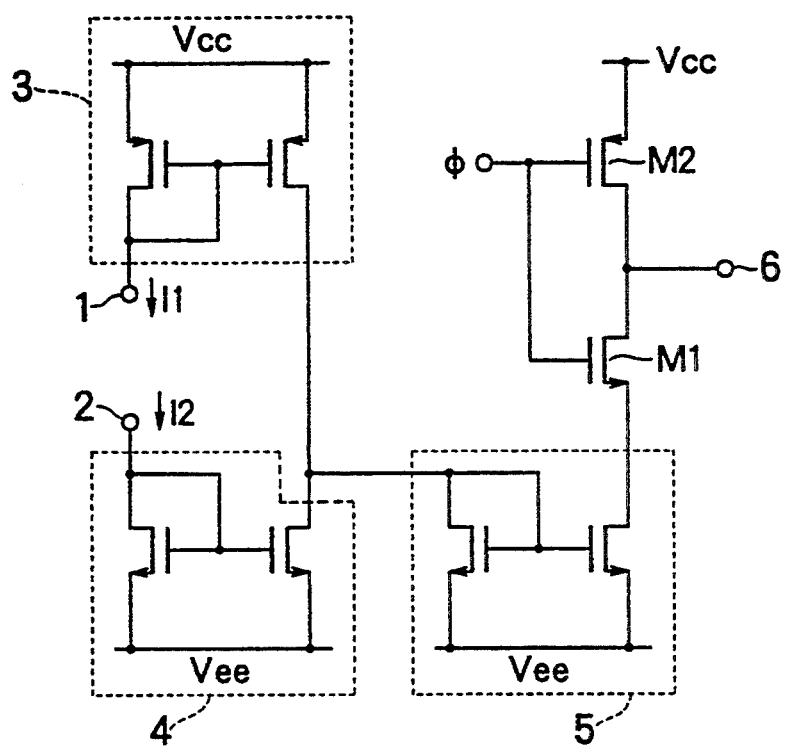
FIG. 8 is a circuit diagram of a current comparator according to a sixth embodiment of the present invention.

A sixth embodiment will now be described, with reference to FIG. 8.

This current comparator is characterized in that (1) the resistor R is eliminated, (2) an N-channel MOS transistor M1 and a P channel MOS transistor M2 are serially connected between the current output terminal of the third current mirror circuit 5 and a terminal to which the high power-source voltage Vcc is applied, (3) the gate voltages of the transistors M1 and M2 are controlled by the clock φ, and (4) the comparison result output terminal 6 is connected to a node of the transistors M1 and M2.

When the clock φ turns to an "L" level, the transistors M1 and M2 are turned off and on, respectively. Thus, the potential of the comparison result output terminal 6 is recharged to a "H" level. During this interval, the first and second current mirror circuits 3 and 4 compare currents. Accordingly, the gate voltage of the output transistor in the third current mirror circuit 5 turns to a higher or lower threshold voltage depending on the comparison result. When the clock φ goes to "H" level, the transistors M1 and M2 are turned on and off, respectively. Accordingly, the third current mirror circuit 5 keeps the potential of the comparison result output terminal 6 at the "H" level or discharges it to the "L" level, depending on the comparison result.

In this current comparator, no through or rush current flows through the circuits of the output stage (transistors M1, M2, and the output transistor of the third current mirror circuit 5). Accordingly, power dissipation is reduced.

As has been described above, according to the present invention, the current levels of two input currents can be compared and the comparison result output directly. Further, even if the current levels of the currents I1 and I2 are approximately same as each other, no through current flows.

The present invention is not limited to the above embodiments. For example, in the above embodiments, the transistors are MOSFETs. However, the transistors may instead be bipolar transistors. In this case, for example, the P-channel MOS transistors are replaced by PNP bipolar transistors and the N-channel MOS transistors are replaced by NPN bipolar transistors. Moreover, the high power-source voltage Vcc and a lower power-source voltage Vee may be replaced with other voltages. Further, different voltages may be applied to the first current mirror circuit and the register R, as well as to the second and third current mirror circuits 4 and 5.

Figure 9:
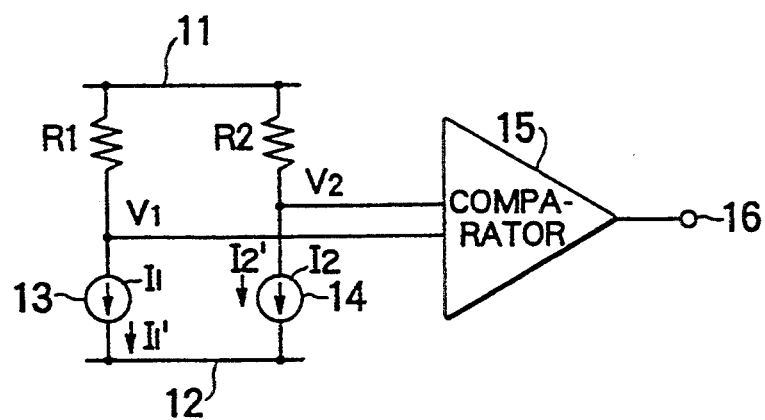
FIG. 9 is a circuit diagram of a current comparator according to a seventh embodiment of the present invention.

FIG. 9 shows a seventh embodiment of the present invention. This current comparator differs from the current comparators in the first through sixth embodiments in that the current levels are converted into voltage levels and then the voltage levels are compared by the voltage comparators.

The current comparator shown in FIG. 9 comprises a first constant voltage source 11, a second constant voltage source 12, a first constant current source 13, a second constant current source 14, a voltage comparator 15, a comparison result output terminal 16, and first and second resistors R1 and R2.

One terminal of the first resistor R1 is connected to the first constant voltage source 11. The first constant current source 13 is connected between the other terminal of the first resistor R1 and the second constant voltage source 12, and supplies a current Ii proportional to an input current Iin. One terminal of the second resistor R2 is connected to the first constant voltage source 11, and the second constant current source 14 is connected between the other terminal of the second resistor R2 and the second constant voltage source 12 and supplies a reference current Ir. The voltage comparator 15 compares a voltage V1 at the other terminal of the first resistor R1 with a voltage V2 at the other terminal of the second resistor R2, and outputs a signal indicating a comparison result to the comparison result output terminal 16. The first and second constant current sources 13 and 14 each comprise a current mirror circuit.

What is claimed is:

1. A current comparator, comprising:
    first and second input terminal to which first and second currents to be compared are supplied;
    a first current mirror circuit, whose current input terminal is coupled to the first input terminal;
    a second current mirror circuit, whose current input terminal is coupled to the second input terminal and whose current output terminal is coupled to an current output terminal of the first current mirror circuit;
    a third current mirror circuit, whose current input terminal is coupled to a node of the current output terminals of the first and second current mirror circuits;
    a load circuit coupled between a current output terminal of the third current mirror circuit and a terminal to which a first voltage is applied; and
    a comparison result output terminal coupled to the load circuit.

2. The current comparator circuit according to claim 1, wherein the first current mirror circuit is comprised of a first-conductivity-type transistor and the second current mirror circuit is comprised of a second-conductivity-type transistor, the second-conductivity-type being different from the first-conductivity-type.

3. The current comparator according to claim 1, wherein the load circuit is comprised of any one of a resistor, a variable resistor and a transistor.

4. The current comparator according to claim 1, wherein the load circuit is comprised of a switch coupled to the third current mirror circuit and a load coupled between the switch and the terminal to which the first voltage is applied, and the comparison result output terminal is coupled to a node of the switch and the load.

5. The current comparator according to claim 1, wherein the load circuit is comprised of:
    a first transistor of a first conductivity type having a current path whose one terminal is coupled to the current output terminal of the third current mirror circuit; and
    a second transistor of a second conductivity type different from the first conductivity type and having a current path whose one terminal is coupled to the terminal to which the first voltage is applied and the other terminal thereof is coupled to the other terminal of the current path of the first transistor;
    and wherein a common control signal is supplied to the first and second transistors.

6. A current comparator, comprising:
    first circuit means, having a first input terminal and a first output terminal, for flowing through the first output terminal a current equivalent to a current supplied to the first input terminal;
    second circuit means having a second input terminal to which a second current is supplied and a second output terminal coupled to the first output terminal, for flowing the second current through the second output terminal when the first current is larger than the second current and for flowing the first current through the second output terminal when the first current is smaller than the second current;
    third circuit means having a third output terminal and a third input terminal coupled to a node of the first and second output terminals, for receiving at the third input terminal the difference of the first and second currents and flowing a current equivalent to the difference through the third output terminal when the first current is larger than the second current, and for receiving no current at the third input terminal and for setting the third output terminal to an open state when the first current is smaller than the second current; and
    a load circuit coupled between the third output terminal and a terminal to which a predetermined voltage is supplied; and
    a comparison result output terminal coupled to the load circuit.

7. The current comparator according to claim 6, wherein the first current mirror circuit is comprised of a first-conductivity-type transistor and the second current mirror circuit is comprised of a second-conductivity-type transistor, the second-conductivity-type being different from the first-conductivity-type.

8. The current comparator according to claim 7, wherein the first through third circuit means comprise first through third current mirror circuits, respectively.

9. The current comparator according to claim 6, wherein the load circuit is comprised of any one of a resistor, a variable resistor, and a transistor.

10. The current comparator according to claim 6, further comprising a switch coupled between the load circuit and the third circuit means and wherein the comparison result output terminal is coupled to a node of the switch and the load circuit.

11. The current comparator according to claim 6, wherein the load circuit comprises:
    a first transistor of a first conductivity type having a current path whose one terminal is coupled to the third output terminal; and
    a second transistor of a second conductivity type different from the first conductivity type and having a current path whose one terminal is coupled to the terminal to which the predetermined voltage is applied and the other terminal thereof is coupled to the other terminal of the current path of the first transistor;
    and wherein a common control signal is supplied to the first and second transistors.

* * * * *